United States Patent [19]
Izumiyama

[11] Patent Number: 6,141,561
[45] Date of Patent: Oct. 31, 2000

[54] RECEPTION CIRCUIT FOR CELLULAR TELEPHONE

[75] Inventor: Toru Izumiyama, Fukushima-ken, Japan

[73] Assignee: Alps Electric Co., Ltd., Japan

[21] Appl. No.: 09/059,997

[22] Filed: Apr. 13, 1998

[51] Int. Cl.[7] .................................................. H04B 1/16
[52] U.S. Cl. ............................ 455/550; 455/217; 330/52
[58] Field of Search .............................. 455/217, 226.1, 455/226.2, 230, 287, 291, 250.1, 245, 254; 330/52, 136, 137, 129, 132, 140, 284

[56] References Cited

U.S. PATENT DOCUMENTS

| | | | |
|---|---|---|---|
| 5,230,096 | 7/1993 | Davies et al. | 455/217 |
| 5,513,386 | 4/1996 | Ogino et al. | |
| 5,617,240 | 4/1997 | Hergault et al. | 359/194 |
| 5,678,214 | 10/1997 | Azuma | 455/217 |
| 5,722,063 | 2/1998 | Peterzell et al. | 455/287 |
| 5,963,087 | 10/1999 | Anderson | 330/52 |
| 5,963,855 | 10/1999 | Lussenhp et al. | 455/226.2 |

FOREIGN PATENT DOCUMENTS

| | | |
|---|---|---|
| 777 334 A2 | 6/1997 | European Pat. Off. . |
| 7-297752 | 11/1995 | Japan . |
| 9-102757 | 4/1997 | Japan . |

Primary Examiner—Daniel S. Hunter
Assistant Examiner—Pablo Tran
Attorney, Agent, or Firm—Brinks Hofer Gilson & Lione

[57] ABSTRACT

A reception circuit for a cellular telephone according to the present invention shares the use of a code division multiple access system and a frequency division multiple access system, comprises: an amplifier circuit at the forefront stage; a bypass circuit connected to the amplifier circuit at the forefront in parallel therewith, having lower gain than the amplifier circuit at the forefront stage; and a common processing circuit connected to the latter stages of the amplifier circuit at the forefront and the bypass circuit, and when the level of a received signal is not higher than predetermined voltage, induces the received signal to the processing circuit through the amplifier circuit at the forefront while when the level of the received signal exceeds the predetermined voltage, the received signal is induced to the processing circuit through the bypass circuit.

10 Claims, 2 Drawing Sheets

RECEPTION CIRCUIT FOR CELLULAR TELEPHONE

BACKGROUND OF THE INVENTION

1. Field of the Invention

The present invention relates to a reception circuit for a cellular telephone which shares the use of both a code division multiple access system and a frequency division multiple access system, and more particularly to a peripheral circuit including a low noise amplifier circuit in a reception circuit.

2. Description of the Related Art

With reference to FIG. 3, the description will be made of a part of a conventional reception circuit for so-called dual-mode cellular telephone, for which two systems: code division multiple access system and frequency division multiple access system can be used.

In FIG. 3, the cellular telephone is capable of transmitting to and receiving from a base station by either the code division multiple access system (hereinafter, referred to as CDMA mode), or the frequency division multiple access system (hereinafter, referred to as FM mode). A transmission signal from a transmission circuit 41 is transmitted from an antenna 43 toward a base station (not shown) through an antenna multiplexer 42, while a transmission signal from a base station (not shown) is received by the antenna 43, and is inputted to a reception circuit 44 through the antenna multiplexer 42.

A transmission signal (received signal of the cellular telephone) from a base station (not shown) has a frequency of a band of 880 MHz, and within this band, a frequency for use is allocated according to the respective mode. Also, a band width occupied by one call channel is nearly 1.23 MHz in the CDMA mode, and nearly 30 KHz in the FM mode. Transmission signals in these two modes are always inputted to the antenna 43 in a mixed state.

Next, the reception circuit 44 will be described below. A received signal of a nearly 880 MHz band inputted through the antenna multiplexer 42 is amplified by a low noise amplifier circuit 45, thereafter passes through a SAW filter 46, and is inputted to a mixer circuit 47, whereby they are converted into an intermediate frequency of nearly 85 MHz. After being amplified by next intermediate frequency amplifier circuits 48 and 49 (two-stage structure is shown here), a sound signal is fetched by a demodulator circuit (not shown) and the like, connected to the latter stages of these intermediate frequency amplifier circuits 48 and 49.

The intermediate frequency signal is detected by the demodulator circuit (not shown) connected to the latter stages of the intermediate frequency amplifier circuits 48 and 49, and this detected voltage is supplied to the intermediate frequency amplifier circuits 48 and 49 through an AGC voltage terminal 50 as ACC voltage. In this respect, between the antenna multiplexer 42 and the low noise amplifier circuit 45, there is provided an impedance matching circuit 53 consisting of inductors 51 and 52 which are connected to each other in a L-character shape so as to match output impedance of the antenna multiplexer 42 and input impedance of the low noise amplifier circuit 45.

The low noise amplifier circuit 45 is constituted by amplification elements such as bipolar transistor 54, fixed bias voltage is applied to its base, and a common-emitter type is used. A received signal amplified by the transistor 54 is fetched from the collector of the transistor 54 through a coupling capacitor 55 and is inputted to the SAW filter 46.

In the cellular telephone system, a signal level transmitted from a base station to a cellular telephone, which is a mobile station, is always constant. For this reason, if the cellular telephone is far away from the base station, the received signal level becomes low, but the received signal level becomes high in the vicinity of the base station to the contrary. The level of a signal transmitted from the base station is maintained on a sufficient level so that it can be received even by a cellular telephone at a distant place. Accordingly, the reception circuit 44 for a cellular telephone has a great dynamic range (nearly 80 dB) so as to receive a low-level signal to a high-level signal without distortion. To this end, the reception circuit 44 controls the gain of the intermediate frequency amplifier circuit 48 and 49 constituted by a predetermined number of stages with AGC voltage so as to withstand this great dynamic range.

On the other hand, in order that the level of a signal transmitted from a cellular telephone toward a base station may become constant on the base station side, the transmitted signal level is made high if the cellular telephone is far away from the base station, and is made low in the vicinity of the base station. For this reason, the transmission circuit 41 has also a great dynamic range (nearly 80 dB) so as to transmit a low-level signal to a high-level signal.

As described above, a signal transmitted from the base station is transmitted at such a level as to be receivable even by a cellular telephone at a distant place. Therefore, for example, if the cellular telephone is used in the vicinity of the base station, an exceedingly-high level signal will be received, and accordingly, the gain of the intermediate frequency amplifier circuits 48 and 49 is reduced through AGC voltage from the ACC voltage terminal 50, the level of a signal inputted to a demodulator circuit and the like at the latter stage (not shown) is made constant, and particularly the intermediate frequency amplifier circuit 49 at the second stage and the subsequent circuits are adapted to cause no distortion.

If, however, a specified cellular telephone is used in a distant area from a base station, the reception level of a transmitted signal (hereinafter, referred to as a desired signal) from the base station becomes low, and therefore, AGC voltage, at which these intermediate frequency amplifier circuits 48 and 49 have the maximum gain, is supplied to these intermediate frequency amplifier circuits 48 and 49, resulting in that the intermediate frequency amplifier circuits 48 and 49 enter an activated state with the maximum gain. If, in such a state, there exists another cellular telephone transmitting to and receiving from the base station in a near district, this cellular telephone is transmitting a high-level signal (hereinafter, referred to as non-desired signal) and therefore, a high-level non-desired signal from another cellular telephone will be inputted to the reception circuit 44 through the antenna 43 of the specified cellular telephone.

Therefore, the low noise amplifier circuit 45 amplifies both the desired signal and the non-desired signal at the same time, and yet the level of the non-desired signal is high. Accordingly, there arises a problem that great distortion due to mutual modulation will occur in this low noise amplifier circuit 45. Also, since the non-desired signal amplified by the low noise amplifier circuit 45 is inputted to a mixer circuit 47 through the SAW filter 46, great distortion due to mutual modulation occurs also in this mixer circuit 47.

Further, since the specified cellular telephone generates AGC voltage on the basis of the desired signal from the base station as described above, the intermediate frequency amplifier circuits 48 and 49 operate in a maximum gain state. To that end, the received signal amplified by the low noise amplifier circuit 45 and inputted through the mixer circuit 47 will be further amplified by the intermediate frequency amplifier circuits 48 and 49. Therefore, particularly, the operation of the intermediate frequency amplifier circuit 49 at the latter stage will be saturated to cause more and more great distortion, thus resulting in call impossibility in the worst case. That is, the receive interference will occur due to the non-desired signal from the another cellular telephone.

Particularly when this specified cellular telephone is used in the CDMA mode, receive interference is more prone to occur than when it is used in the FM mode. As one of the reasons, it is considered that the band width of one call channel is large (1.23 MHz) in the CDMA mode and is small (30 KHz) in the FM mode. In other words, because when the band width of one call channel is large, it is probable that the frequency of mutual modulation distortion caused by the existence of a non-desired signal from another cellular telephone is positioned within the band of this call channel.

Thus, even if in the vicinity of a cellular telephone in use, there may exist another cellular telephone, which is transmitting a high-level signal, the present invention is to prevent receive interference from occurring.

SUMMARY OF THE INVENTION

In order to solve the above-described problem, the reception circuit for a cellular telephone according to the present invention shares the use of a code division multiple access system and a frequency division multiple access system, comprises: an amplifier circuit at the forefront stage; a bypass circuit connected to the amplifier circuit at the forefront in parallel therewith, having lower gain than the amplifier circuit at the forefront stage; and a common processing circuit connected to the latter stages of the amplifier circuit at the forefront and the bypass circuit, and when the level of a received signal is not higher than predetermined voltage, induces the received signal to the processing circuit through the amplifier circuit at the forefront while when the level of the received signal exceeds the predetermined voltage, the received signal is induced to the processing circuit through the bypass circuit.

Also, the reception circuit for a cellular telephone according to the present invention has an intermediate frequency amplifier circuit in the processing circuit, and when AGC voltage for controlling the gain of the intermediate frequency amplifier circuit is not higher than the predetermined voltage, induces the received signal to the processing circuit through the amplifier circuit at the forefront stage while when the AGC voltage exceeds the predetermined voltage, the received signal is induced to the processing circuit through the bypass circuit.

Also, the reception circuit for a cellular telephone according to the present invention comprises: a first switching circuit provided on the input sides of the amplifier circuit at the forefront stage and the bypass circuit; a second switching circuit provided on the output sides of the amplifier circuit at the forefront stage and the bypass circuit; a comparator for outputting a high level signal or a low level signal by comparing the AGC voltage with the predetermined voltage; and a switching circuit for controlling the first and second switching circuits in response to an output signal from the comparator.

Also, in the reception circuit for a cellular telephone according to the present invention, the first switching circuit is constituted by a first switch diode and a second switch diode; the second switching circuit is constituted by a third switch diode and a fourth switch diode; the amplifier circuit at the forefront is provided between the first switch diode and the third switch diode; the bypass circuit is provided between the second switch diode and the fourth switch diode, and when the AGC voltage is not higher than the predetermined voltage, the first and third switch diodes are both caused to be in conduction, and the second and fourth switch diodes are both caused to be in non-conduction, while when the AGC voltage exceeds the predetermined voltage, the first and third switch diodes are both caused to be in non-conduction, and the second and fourth switch diodes are both caused to be in conduction.

Also, in the reception circuit for a cellular telephone according to the present invention, the supply of supply voltage for operating the amplifier circuit at the forefront stage is stopped when the received signal is induced to the processing circuit through the bypass circuit.

Also, in the reception circuit for a cellular telephone according to the present invention, the bypass circuit is provided with attenuating means.

BRIEF DESCRIPTION OF THE DRAWINGS

Other objects, features and advantages of the present invention will be more apparent as the description proceede taken in connection with the accompanying drawings in which.

DETAILED DESCRIPTION OF PREFERRED EMBODIMENT

Figure 1:
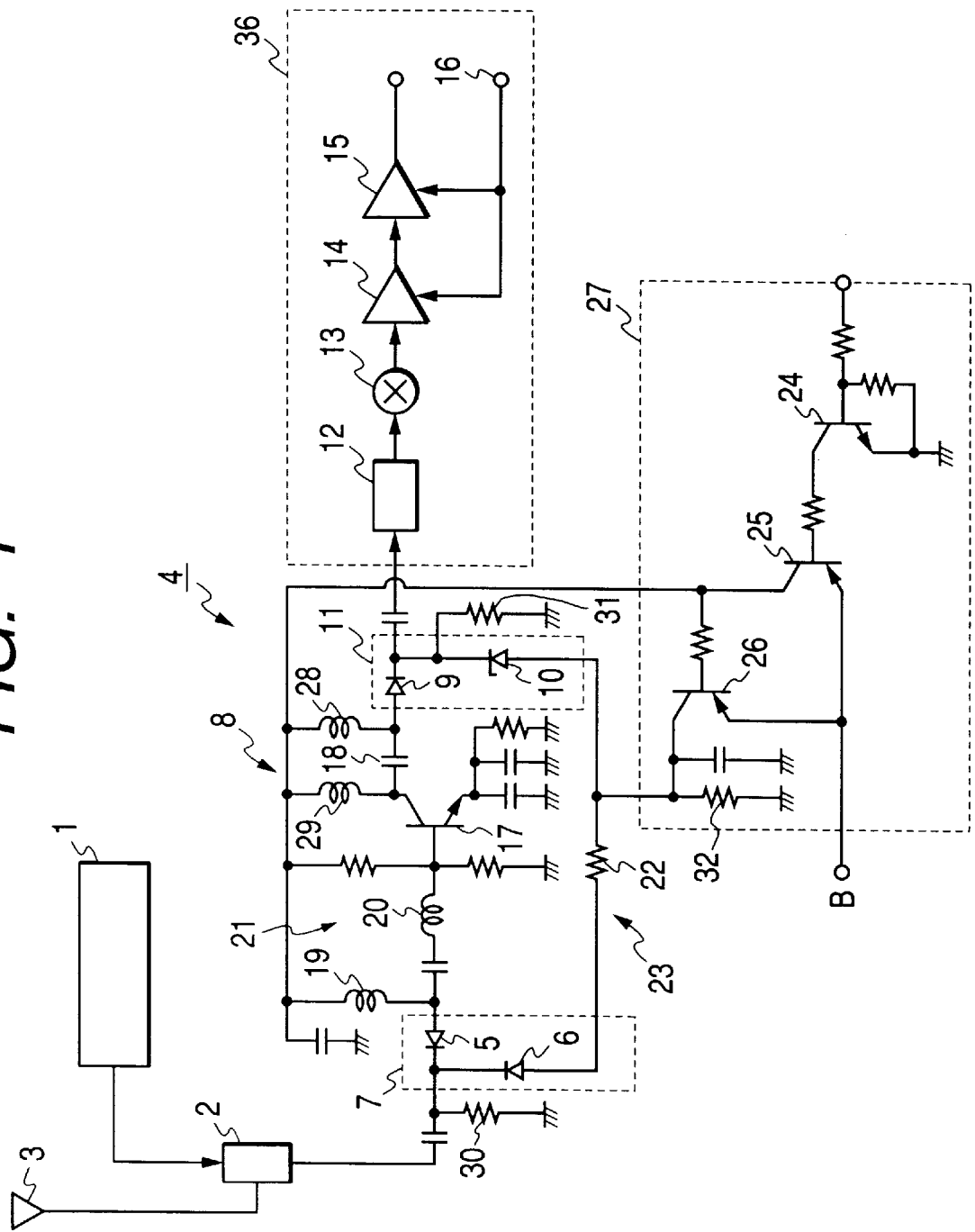
FIG. 1 is an explanatory view showing a reception circuit for a cellular telephone according to the present invention.

Hereinafter, the reception circuit for a cellular telephone according to the present invention will be described in conjunction with FIGS. 1 and 2. First, in FIG. 1, the cellular telephone is capable of transmitting to and receiving from a base station by either the code division multiple access system (hereinafter, referred to as CDMA mode) or the frequency division multiple access system (hereinafter, referred to as FM mode). A transmission signal from a transmission circuit 1 is transmitted from an antenna 3 toward a base station (not shown) through an antenna multiplexer 2, while a transmission signal from a base station (not shown) is received by the antenna 3, and is inputted to a reception circuit 4 through the antenna multiplexer 2.

A transmission signal (received signal of the cellular telephone) from the base station (not shown) has a frequency of a 880 MHz band, and within this band, a frequency for use is allocated according to the respective mode. In the mean time, a band width occupied by one call channel is nearly 1.23 MHz in the CDMA mode, and nearly 30 KHz in the FM mode. Transmission signals in these two modes are always inputted to the antenna 3 in a mixed state Next, the reception circuit 4 will be described below. A received signal of a nearly 880 MHz band inputted through the antenna multiplexer 2 is inputted to a low noise amplifier circuit 8, which is an amplifier circuit at the forefront through one diode (first diode) 5 of a first switching circuit 7 consisting of a first switch diode 5 and a second switch diode 6 in which cathodes are connected. Then, after being amplified by the low noise amplifier circuit 8, the received signal is inputted to a SAW filter 12 through one diode (third switch diode) 9 of a second switching circuit 11 consisting of a third switch diode 9 and a fourth switch diode 10 in which cathodes are connected.

The received signal, which has passed through the SAW filter 12, is inputted to a mixer circuit 13 and converted into an intermediate frequency of nearly 85 MHz. After being amplified by next gain-variable intermediate frequency amplifier circuits 14 and 15 (two-stage structure is shown here), a sound signal is fetched by a demodulator circuit (not shown) and the like connected to the latter stages of these intermediate frequency amplifier circuits 14 and 15. Also, the intermediate frequency signal is detected by a detection circuit (not shown) connected to the latter stages of the intermediate frequency amplifier circuits 14 and 15, and this detected voltage is supplied to the intermediate frequency amplifier circuits 14 and 15 through an AGC voltage terminal 16 as AGC voltage to thereby change its gain.

The low noise amplifier circuit 8 is constituted in a common-emitter type using an amplification element such as a bipolar transistor 17, and applying fixed bias voltage to its base. A received signal amplified by the transistor 17 is fetched from its collector through a coupling capacitor 18 and is inputted to the SAW filter 12 through a third switch diode 9 of the second switching circuit 11. In this respect, between the anode of the first switch diode 5 in the first switching circuit 7 and the low noise amplifier circuit 8, there is provided a matching circuit 21 consisting of the first inductor 19 and the second inductor 20 which are connected in a L-character shape so as to match output impedance of the antenna multiplexer 2 with input impedance of the low noise amplifier circuit 8.

One end of the first inductor 19 and one end of the second inductor 20 are connected to each other in view of radio frequency, and this one end of the first inductor is connected to the anode of the first switch diode 5, and the other end of the first inductor is grounded in view of radio frequency. Also, the other end of the second inductor 20 is connected to the base of the transistor 17.

On the other hand, there is provided a resistance 22 between the anode of the other switch diode (second switch diode) 6 of the first switching circuit 7 and the anode of the other switch diode (fourth switch diode) 10 of the second switching circuit 11. By switching the first switching circuit 7 and the second switching circuit 11, a received signal inputted through the antenna multiplexer 2 is arranged to be either inputted to the SAW filter 12 through the low noise amplifier circuit 8, or inputted to the SAW filter 12 through the resistance 22 provided between the second switch diode 6 and the fourth switch diode 10. Accordingly, a signal transmission line, in which the resistance 22 is provided, constitutes a bypass circuit 23 relative to the low noise amplifier circuit 8. Also, this SAW filter 12, the mixer circuit 13, the intermediate frequency amplifier circuits 14 and 15 and the like, which follow the SAW filter, constitute a processing circuit 36 in the latter stage which is common to the low noise amplifier circuit 8 and the bypass circuit 23.

In the cellular telephone system, the level of a signal transmitted to a cellular telephone, which is a mobile station, from a base station is always maintained constant. For this reason, if the cellular telephone is far away from the base station, the received signal level becomes low, and becomes high in the vicinity of the base station to the contrary. However, the signal transmitted from the base station is maintained at such a sufficiently high level that even a cellular telephone at a distant place can receive. Therefore, the reception circuit 4 for the cellular telephone has a great dynamic range (nearly 80 dB) so that a low-level signal (nearly −105 dBm) to a high-level signal (nearly −25 dBm) can be received without distortion. To that end, in order that the reception circuit 4 may withstand this great dynamic range, the gain of the gain-variable intermediate frequency amplifier circuits 14 and 15 composed of a predetermined number of stages is controlled with AGC voltage.

On the other hand, the level of a signal transmitted from the cellular telephone toward the base station is made high when it is far away from the base station, and is made low when it is near to the base station so as to become constant at the base station. To that end, the transmission circuit 1 has also a great dynamic range (nearly 80 dB) so as to transmit a low-level signal to a high-level signal.

Since transmission is performed at such a level as to be receivable even by a cellular telephone at a distant place as described above, an exceedingly high level signal is to be received when, for example, a cellular telephone is used near the base station. Therefore, distortion is prevented from occurring particularly in the intermediate frequency amplifier circuit 15 at the second stage and the subsequent circuits by reducing the gain in the intermediate frequency amplifier circuits 14 and 15 through AGC voltage from the AGC voltage terminal 16.

In the present invention, there is provided a switching circuit 27 consisting of three switch transistors 24, 25 and 26 in such a manner that in the CDMA mode, the switching circuit 27 causes the second switch diode 6 in the first switching circuit 7 and the fourth switch diode 10 in the second switching circuit 11 to be in conduction, and the first switch diode 5 in the first switching circuit 7 and the third switch diode 9 in the second switching circuit 11 to be in non-conduction. Thus, a received signal based on the code division multiple access system inputted through the antenna multiplexer 2 is arranged to be inputted to the SAW filter 12 not through the low noise amplifier circuit 8 but through the bypass circuit 23.

Also, in the FM mode, the first switch diode 5 in the first switching circuit 7 and the third switch diode 9 in the second switching circuit 11 are caused to be in conduction, and the second switch diode 6 in the first switching circuit 7 and the fourth switch diode 10 in the second switching circuit 11 are caused to be in non-conduction. Thus, a received signal based on the frequency division multiple access system inputted through the antenna multiplexer 2 is arranged to be amplified by the low noise amplifier circuit 8 and inputted to the SAW filter 12.

More specifically, a switching signal for switching this cellular telephone to the CDMA mode or the FM mode is caused to be inputted to the base of the first switch transistor 24 of NPN type emitter-grounded in the switching circuit 27, supply voltage B is applied to the emitter of the second switch transistor 25 of PNP type, whose base is connected to the collector of the first switch transistor 24, the collector of the second switch transistor 25 is connected to the anode of the first switch diode 5 in the first switching circuit 7 through the first inductor 19 of the matching circuit 21, and is also connected to the anode of the third switch diode 9 in the second switching circuit 11 through a choke inductor 28. Further, the collector of the second switch transistor 25 is connected to the collector of the transistor 17 in the low noise amplifier circuit 8 through a load inductor 29 of the transistor 17.

Also, there is provided the third switch transistor 26 of PNP type whose base is connected to the collector of the second switch transistor 25, the collector of the third switch transistor 26 is connected to a connection point between the resistance 22 of the bypass circuit 23 and the anode of the fourth switch diode 10 in the second switching circuit 11, and further, the supply voltage B is applied to its emitter together with the emitter of the second switch transistor 25. Thus, a switching signal to low level ("0") is arranged to be applied to the base of the first switch transistor 24 in the CDMA mode, and a switching signal to high level ("1"), in the FM mode.

The respective cathodes of the first and second switch diodes 5 and 6 in the first switching circuit 7 are grounded through a common bias resistance 30, and the respective cathodes of the third and fourth switch diodes 9 and 10 in the second switching circuit 11 are also grounded through a common bias resistance 31. Further, the collector of the third switch transistor 26 is grounded through a bias resistance 32.

In the FM mode, when a high-level switching signal is applied to the base of the first switch transistor 24, the collectors of the first and second switch transistors 24 and 25 are conductively connected to the emitters thereof respectively so that the supply voltage B is applied to the anodes of the first and third switch diodes 5 and 9. Thus, these switch diodes 5 and 9 are conductively connected with each other, and the supply voltage B is applied to the collector of the transistor 17 in the amplifier circuit. Also, the collector of the third switch transistor 26 is conductively disconnected from the emitter thereof, and accordingly, the supply voltage B is not supplied to the respective anodes of the second and fourth switch diodes 6 and 10, but these switch diodes 6 and 10 enter an inverse bias state, and are not conducting. Therefore, a received signal inputted through the antenna multiplexer 2 does not pass through the bias circuit 23, but is amplified by the low noise amplifier circuit 8 to be inputted to the SAW filter 12.

On the other hand, in the CDMA mode, when a low-level switching signal is applied to the base of the first switch transistor 24, the collector of the second switch transistor 25 is conductively disconnected from the emitter thereof, and the supply voltage B is not applied to the first and third switch diodes 5 and 9, but enter an inverse bias state and are not conducting. Also, the supply voltage B is not supplied either to the collector of the transistor 17 in the low noise amplifier circuit 8. On the other hand, the collector of the third transistor 26 is conductively connected to the emitter thereof so that supply voltage is applied to the anodes of the second and fourth switch diodes 6 and 10 for conduction. Therefore, the received signal inputted through the antenna multiplexer 2 is inputted to the SAW filter 12 through the bypass circuit 23 without passing through the low noise amplifier circuit 8.

Therefore, in the CDMA mode, even if there exists another cellular telephone which is transmitting a high-level signal in the vicinity within an area where this cellular telephone is used, no distortion due to mutual modulation occurs in this low noise amplifier circuit 8 because no high-level signal from another cellular telephone is inputted to the low noise amplifier circuit 8. Also, since the received signal is inputted to the SAW filter 12 through the bypass circuit 23, the signal to be inputted to this SAW filter 12 is inputted at a lower level than a level amplified by the gain of the low noise amplifier circuit 8. Therefore, distortion due to mutual modulation caused in the mixer circuit 13 and the intermediate frequency amplifier circuits 14 and 15 which are connected to the latter stage of the SAW filter 12 becomes less. In this case, the more the value of the resistance 22 in the bypass circuit 23 is increased, the less this distortion can be made.

Also, in the FM mode, the second and fourth switch diodes 6 and 10 enter an inverse bias state and are not conducting, and therefore, the received signal from the antenna multiplexer 2 does not flow into the bypass circuit 23, and the received signal amplified by the low noise amplifier circuit 8 does not flow backwards through the bypass circuit 23 either. Similarly, in the CDMA mode, the first and third switch diodes 5 and 9 enter an inverse bias state and are not conducting, and therefore, the received signal from the antenna multiplexer 2 does not flow into the matching circuit 21, and the received signal from the fourth switch diode 10 in the bypass circuit 23 does not flow backwards through the low noise amplifier circuit 8 either. Therefore, the bypass circuit 23 can be well isolated from the matching circuit 21 and the low noise amplifier circuit 8.

In this respect, in the CDMA mode, since the transistor 17 in the low noise amplifier circuit 8 is in a non-activated state, it becomes difficult, even only for this reason, for the received signal from the fourth switch diode 10 in the bypass circuit 23 to flow backwards through the low noise amplifier circuit 8. Therefore, the isolation does not pose any problem in practical use even if the third switch diode 9 is not provided. In this case, the second switching circuit 11 becomes simpler because the third switch diode 9 is not provided.

In this respect, when the received signal based on the CDMA mode exceeds a predetermined level, it is also possible to input a low-level switching signal in the CDMA mode to be inputted to the base of the first switch transistor 24. More specifically, when the received signal based on the CDMA mode is at a low level (range of nearly −105 dBm to −95 dBm), a high-level switching signal is applied to the base of the first switch transistor 24 in advance, and a low-level switching signal is caused to be inputted when the received signal is at a high level (for example, when −90 dBm is exceeded).

If performed as described above, a disturbing signal will be amplified by the low noise amplifier circuit 8 within a range of low level disturbing signals also in the CDMA mode, but distortion due to mutual modulation produced in the low noise amplifier circuit 8 will be able to be reduced because the signal level is low. Also, since it does not pass through the bypass circuit 23, but is amplified by the low noise amplifier circuit 8, the carrier to noise ratio of the desired signal is also improved. Therefore, the level of the received signal on switching to the bypass circuit can be appropriately set by considering trade off between distortion through a disturbing signal and the carrier to noise ratio of the desired signal. Further, when switched to the bypass circuit 23, the level of a signal inputted to the SAW filter 12, the mixer circuit 13, the intermediate frequency amplifier circuits 14 and 15 and the like depends upon the value of the resistance 22 of the bypass circuit 23, and affects the distortion in these processing circuits and the carrier to noise ratio. Accordingly, the value of the resistance 22 can be appropriately set also from this viewpoint.

Figure 2:
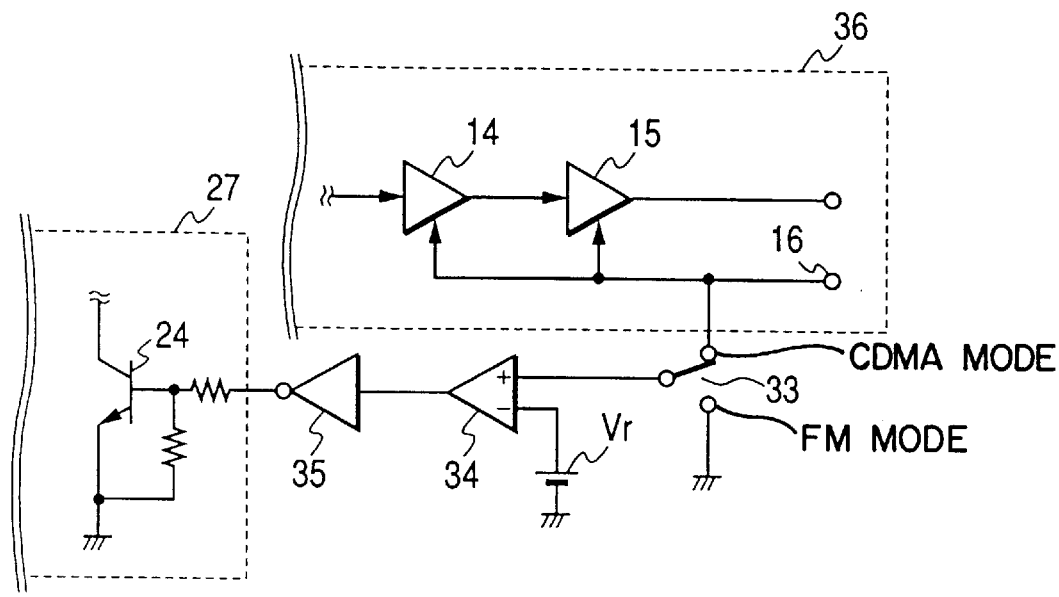
FIG. 2 is another explanatory view showing a reception circuit for a cellular telephone according to the present invention.
Figure 3:
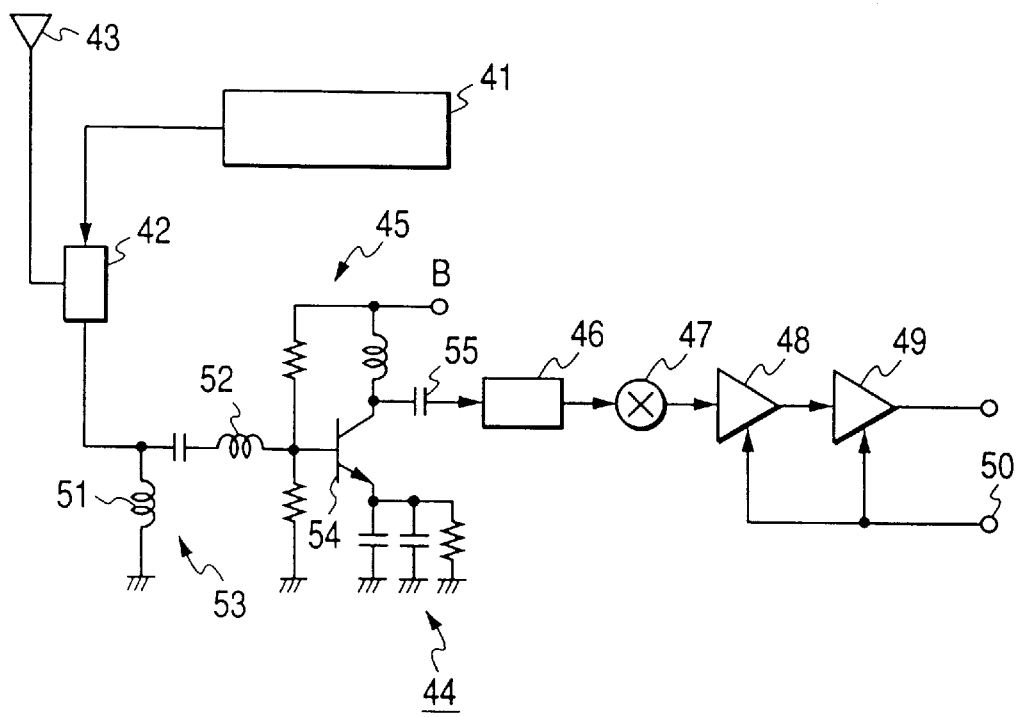
FIG. 3 is an explanatory view showing a reception circuit for a conventional cellular telephone.

In this case, as shown in FIG. 2, AGC voltage from an AGC voltage terminal 16 is inputted to a comparator 34 through a change-over switch 33 between CDMA mode and FM mode, and a switching signal is generated by comparing it with reference voltage Vr by this comparator 34 to be inputted to the first switch transistor 24. The reference voltage Vr has been set at the same voltage as AGC voltage developed at the AGC voltage terminal 16 when the input signal level is, for example, −90 dBm. Thus, when the input signal level exceeds −90 dBm, the output from the comparator 34 is at a high level, is converted into a low level by the next inverter 35, and is inputted to the base of the first switch transistor 24 to interrupt continuity between collector and emitter. As a result, the collector of the third switch transistor 26 shown in FIG. 1 is conductively connected to the emitter thereof, and the second and fourth switch diodes in the bypass circuit 23 are conductively connected.

If the input signal level is lower than −90 dBm, the output from the comparator 34 is in a low level state, a high-level switching signal is inputted to the base of the first switch transistor 24, the collector and the emitter of the second switch transistor 25 are conductively connected so that the first and third switch diodes are conductively connected and the supply voltage B is supplied to the collector of the transistor 17 in the low noise amplifier circuit 8. Also when the change-over switch 33 is connected to the FM mode side, the output from the comparator 34 is at a low level, a high-level switching signal is inputted to the base of the first switch transistor 24, the collector and the emitter of the second switch transistor 25 are conductively connected so that the first and third switch diodes are conductively connected and the supply voltage B is supplied to the collector of the transistor 17 in the low noise amplifier circuit 8.

By thus generating a switching signal to the first switch transistor 24 by the comparison between the AGC voltage and the reference voltage, a received signal in the CDMA mode can be caused to pass through the bypass circuit 23 at any level of the input signal.

As has been discussed above, the present invention offers the following advantages:

In the arrangement in which signals received under the CDMA system go through the bypass circuit 23, whereas signals received under the FM system go through the amplifier circuit 8, an intermodulation distortion in the amplifier circuit 8 can be suppressed that could occur, on signals received under the CDMA system, due to another cellular phone located nearby and transmitting signals at a high level. The intermodulation distortion can also be reduced to a minimal level that could occur in the mixer circuit 13 or the intermediate frequency amplifier circuit 14 and/or 15.

In the arrangement in which signals received under the CDMA system go through the bypass circuit 23 when the signal level is not lower than a threshold value and otherwise go through the amplifier circuit 8, the C/N ratio of the received signals cannot be lowered. Usually, there is a tradeoff between suppression of an intermodulation distortion and improvement of an C/N ratio. But by carefully choosing the threshold value, it is possible to balance these two competing factors.

Also, an arrangement may be possible in which the AGC voltage is compared by a comparator 34 to a threshold voltage to determine whether signals received under the CDMA system should go through the bypass circuit 23 or the amplifier circuit 8. In this arrangement, the first and second switching circuits 7 and 11 can easily be switched merely by setting the threshold voltage.

In the arrangement in which a power supply to the amplifier circuit 8 is cut off when signals flow through the bypass circuit 23, the transistor 17 in the amplifier circuit 8 is inactivated when signals flow through the bypass circuit 23, thereby preventing a back flow of the signals. This arrangement makes possible to simplify the constitution of the second switching circuit 11.

In the arrangement in which the first and second switching circuits 7 and 11 include the first and second switch diodes 5 and 6 and the third and fourth switch diodes 9 and 10, respectively, and the amplifier circuit 8 and the bypass circuit 23 are connected between the first and third switch diodes 5 and 9 and between the second and fourth switch diodes 6 and 10, respectively, and moreover the first and third diode pair and the second and fourth diodes pair are alternately switched between the conductive state and the non-conductive state, the amplifier circuit 8 and the bypass circuit 23 are electrically isolated from each other and free from interference of the other.

Lastly, in the arrangement in which the bypass circuit includes the attenuation means 22, by carefully choosing the resistance of the attenuation means 22, the above two competing factors, i.e., suppression of an intermodulation distortion and improvement of a C/N ratio can be balanced in a wide range.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A reception circuit for use in a cellular telephone adapted to operate under both code division multiple access system and frequency division multiple access system, comprising:

an amplifier circuit provided at the forefront stage of said reception circuit;

a bypass circuit connected in parallel to said amplifier circuit, said bypass circuit having a lower gain than that of said amplifier circuit;

a common processing circuit for processing signals from said amplifier circuit and said bypass circuit;

a first switching circuit connected to input sides of said amplifier circuit and said bypass circuit;

a second switching circuit connected to output sides of said amplifier circuit and said bypass circuit; and a switching control circuit for switching said first and second switching circuits to elect said amplifier circuit or said bypass circuit, alternatively, wherein said switching control circuit switches said first and second switching circuits so that that signals received under the code division multiple access system will go through said bypass circuit and that signals received under the frequency division multiple access system will go through said amplifier circuit.

2. A reception circuit for a cellular telephone according to claim 1, wherein said bypass circuit is provided with attenuating means.

3. A reception circuit for use in a cellular telephone according to claim 1, wherein said first switching circuit comprises a first switch diode and a second switch diode, and said second switching circuit comprises a third switch diode and a fourth switch diode, wherein said amplifier circuit is connected between said first and third switch diodes, and said bypass circuit is connected between said second and fourth switch diodes.

4. A reception circuit for use in a cellular telephone according to claim 1, wherein a power supply for activating said amplifier circuit is cut off while said first and second switching circuits are switched so that signals received under the code division multiple access system flow through said bypass circuit.

5. A reception circuit for use in a cellular telephone adapted to operate under both code division multiple access system and frequency division multiple access system, comprising:

an amplifier circuit provided at the forefront stage of said reception circuit;

a bypass circuit connected in parallel to said amplifier circuit, said bypass circuit having a lower gain than that of said amplifier circuit;

a common processing circuit for processing signals from said amplifier circuit and said bypass circuit;

a first switching circuit connected to input sides of said amplifier circuit and said bypass circuit;

a second switching circuit connected to output sides of said amplifier circuit and said bypass circuit; and a switching control circuit for switching said first and second switching circuits to elect said amplifier circuit or said bypass circuit, alternatively, wherein said switching control circuit switches said first and second switching circuits so that that signals received under the frequency division multiple access system will go through said amplifier circuit, and said switching control circuit switches said first and second switching circuits so that that signals received under the code division multiple access system will go through said bypass circuit if the level of the received signals is lower than a threshold level and go through said amplifier circuit if the level of the received signals is otherwise.

6. A reception circuit for use in a cellular telephone according to claim 5, wherein said common processing circuit comprises at least one gain-variable intermediate frequency amplifier circuit whose gain is controlled by an automatic gain control voltage, and said reception circuit further comprising a comparator for comparing said automatic gain control voltage to said threshold voltage, wherein signals received under the code division multiple access system go through said bypass circuit if said automatic gain control voltage is lower than the threshold voltage and go through said amplifier circuit if said automatic gain control voltage is otherwise.

7. A reception circuit for use in a cellular telephone according to claim 6, wherein said first switching circuit comprises a first switch diode and a second switch diode, and said second switching circuit comprises a third switch diode and a fourth switch diode, wherein said amplifier circuit is connected between said first and third switch diodes, and said bypass circuit is connected between said second and fourth switch diodes, and further wherein said switching control circuit switches both first and third switch diodes into a conductive state and both second and fourth switch diodes into a non-conductive state when said automatic gain control voltage is lower than said threshold value and switches said first, second, third and fourth diodes to the opposite states when said automatic gain control voltage is otherwise.

8. A reception circuit for use in a cellular telephone according to claim 5, wherein a power supply for activating said amplifier circuit is cut off while said first and second switching circuits are switched so that signals received under the code division multiple access system flow through said bypass circuit.

9. A reception circuit for use in a cellular telephone according to claim 6, wherein the threshold value is equal to said automatic gain control voltage the level of the received signals is −90 dBm.

10. A reception circuit for use in a cellular telephone according to claim 5, wherein said bypass circuit is provided with attenuating means.

* * * * *

UNITED STATES PATENT AND TRADEMARK OFFICE
CERTIFICATE OF CORRECTION

PATENT NO.    : 6,141,561
DATED         : October 31, 2000
INVENTOR(S)   : Toru Izumiyama It is certified that error appears in the above-identified patent and that said Letters Patent is hereby corrected as shown below:

Title page,
Item [22], insert a new item as follows:
  -- Foreign Application Priority Data
April 25, 1997 {JP}    Japan    9-109847 --.
Under "U.S. PATENT DOCUMENTS", change "Lussenhp et al." to -- Lussenhop et al. --.

Column 10,
Line 48, delete "that" (second occurrence).

Column 11,
Line 23, delete "that" (second occurrence).
Line 27, delete "that" (second occurrence).

Column 12,
Line 31, change "voltage the" to -- voltage, and the --.

Signed and Sealed this

Eleventh Day of June, 2002

*Attest:*

*Attesting Officer*

JAMES E. ROGAN
*Director of the United States Patent and Trademark Office*